United States Patent [19]

Lee

[11] Patent Number: 4,529,965
[45] Date of Patent: Jul. 16, 1985

[54] SWITCHED-CAPACITOR CIRCUIT ANALOG-TO-DIGITAL CONVERTER

[75] Inventor: Chin-Chen Lee, San Jose, Calif.

[73] Assignee: Racal Data Communications, Milpitas, Calif.

[21] Appl. No.: 491,217

[22] Filed: May 3, 1983

[51] Int. Cl.$^3$ .............................................. H03K 13/02
[52] U.S. Cl. ....................... 340/347 AD; 340/347 NT; 340/347 SH; 330/9; 363/59
[58] Field of Search ......................... 364/844, 829–833, 364/839–840, 862; 340/347 NT, 347 AD, 347 SH, 347 C; 330/9, 51, 107, 109; 307/109, 110, 493; 363/59–61; 328/127; 333/173

[56] References Cited

U.S. PATENT DOCUMENTS

| | | | |
|---|---|---|---|
| 3,251,052 | 5/1966 | Hoffman | 340/347 C |
| 3,745,555 | 7/1973 | Carbrey | 340/347 AD |
| 4,290,034 | 9/1981 | Fraser et al. | 333/173 |
| 4,306,196 | 12/1981 | Dwarakanath et al. | 330/9 |
| 4,315,227 | 2/1982 | Fleischer et al. | 333/173 |
| 4,438,354 | 3/1984 | Haque | 330/9 |

OTHER PUBLICATIONS

McCharles et al., "An Algorithmic Analog-to-Digital Converter," *IEEE Int'l Solid–State Circuits Conf. Digest of Tech. Papers,* pp. 96–97, (1977).

McCharles et al., "Charge Circuits for Analog LSI/", *IEEE Trans. Circuits and Systems,* vol. CAS-25, pp. 490–497, (Jul. 1978).

*Primary Examiner*—Charles D. Miller
*Attorney, Agent, or Firm*—Arnold, White & Durkee

[57] ABSTRACT

A switched-capacitor analog-to-digital converter implements a conversion scheme involving execution of an algorithmic technique of successive-approximation comprising a number of iterations dependent upon the conversion resolution desired. The algorithm used requires analog processing to produce an output voltage that is two times the output voltage resolved to realize the previous bit. The "times two" function is realized by adding the voltage of the last iteration to itself (i.e., $V+V=2V$). This is accomplished by storing the output voltage resolved into the previous bit and separately storing a voltage corresponding to that voltage. Both stored voltages are then transferred to an integrator circuit which adds the two voltages and produces the output voltage to be resolved into the next bit.

22 Claims, 15 Drawing Figures

SWITCHED-CAPACITOR CIRCUIT ANALOG-TO-DIGITAL CONVERTER

BACKGROUND OF THE INVENTION

The present invention relates to analog-to-digital converter (ADC) apparatus; and more particularly, it relates to switched-capacitor circuit ADC apparatus.

Switched-capacitor (SC) circuit technology is finding application in the field of data acquisition, particularly as applied to analog-to-digital conversion. For example, in McCharles et al., "An Algorithmic Analog-to-Digital Converter", *IEEE Int'l Solid-State Circuits Conf. Digest of Tech. Papers* (1977), pp. 96–97, there is described an iterative type A/D converter implemented in SC circuit technology. The apparatus described by McCharles et al. utilizes ratioed capacitors to provide the "times two" function required to implement the successive-approximation algorithm for converting an analog voltage to a multiple bit digital word. Errors in the capacitor ratio produce nonlinear distortion in the transfer function upon reconstruction of the analog signal from the digital words produced by the converter. The nonlinearity can, of course, limit the conversion resolution of the converter.

SUMMARY OF THE INVENTION

The present invention provides an improved switched-capacitor analog-to-digital converter apparatus. The analog-to-digital conversion is made in accordance with an iterative type successive-approximation algorithm. The algorithm involves multiplying the voltage used to realize the previous bit by two, and adding or subtracting a reference voltage depending upon the polarity of the previous voltage. Processing of the previous voltage to obtain a voltage which is two times the previous voltage is referred to herein as a "times two" function.

In accordance with the present invention, the times two function is realized by adding the previous voltage to itself. That is, a voltage two times the previous voltage is obtained by doing a one plus one addition of the previous voltage.

Further in accordance with the present invention, development of an output voltage level that is two times a previously existing output voltage level is accomplished using an integrator circuit. Connected to the integrator circuit is a first means for receiving and storing a voltage corresponding to the previously existing output voltage level. A second means accesses the integrator circuit output to obtain the output voltage level and store the same as the previously existing voltage level. Additional means is included for causing the voltage stored in the first means to be transferred to the integrator circuit, and for causing the voltage in the second means to be transferred to the integrator circuit for addition to the voltage transferred from the first means.

Preferably, the integrator circuit is a switched-capacitor circuit that includes an operational amplifier providing the output voltage level, and an integrating capacitor connectable in a feedback loop between the amplifier input and output, for developing thereon a voltage to be output by the amplifier. The means for storing a voltage corresponding to a previously existing amplifier output voltage level is preferably a storage capacitor connected to the integrating capacitor. The means of accessing the amplifier output for storing an output voltage level as a previously existing amplifier output voltage level is preferably a sample-and-hold circuit or a recycling unity gain buffer. The means for causing the voltage on the storage capacitor to be transferred to the integrating capacitor, and for causing the voltage in the voltage storage means to be transferred back to the integrating capacitor for addition to the voltage transferred from the storage capacitor, is preferably an arrangement of controlled analog switch devices.

An analog-to-digital converter is realized by further inclusion of means connected to the integrator circuit for causing a reference voltage level to be placed on the integrating capacitor along with the voltages transferred from the storage capacitor and the output voltage storing means. The reference voltage is selectively of either polarity based upon the sign of the voltage used to realize the previous binary digit in the conversion. The determination of the sign of a previously existing output voltage level is preferably by a comparator circuit connectable to the integrating amplifier output.

In another aspect of the present invention, input offset voltage compensation for an operational amplifier circuit is provided. In accordance with this aspect of the invention, first and second capacitors are connected to the amplifier input with each capacitor being individually connectable to the amplifier output in a feedback loop or to ground. Means, preferably an arrangement of controlled analog switch devices, applies an input voltage signal level to the first capacitor to establish a voltage thereon that equals the input voltage minus the amplifier offset voltage, and also establishes the offset voltage on the second capacitor. Reconfiguring the circuit using the analog switch devices causes the voltage on the first capacitor to be transferred to the second capacitor, so as to be added to the offset voltage thereon. This forms a composite voltage of $V = (V_{in} - V_{off}) + V_{off} = V_{in}$. This composite voltage on the second capacitor is transferred back to the first capacitor, and the operational amplifier produces an output voltage dependent upon the voltage on the first capacitor.

BRIEF DESCRIPTION OF THE DRAWINGS

A written description setting forth the best mode presently known for carrying out the present invention, and of the manner of implementing and using it, is provided by the following detailed description of preferred embodiments which are illustrated in the attached drawings wherein.

DETAILED DESCRIPTION OF ILLUSTRATIVE EMBODIMENTS

I. Operational Flowchart For Algorithmic Analog-to-Digital Converter

Figure 1:
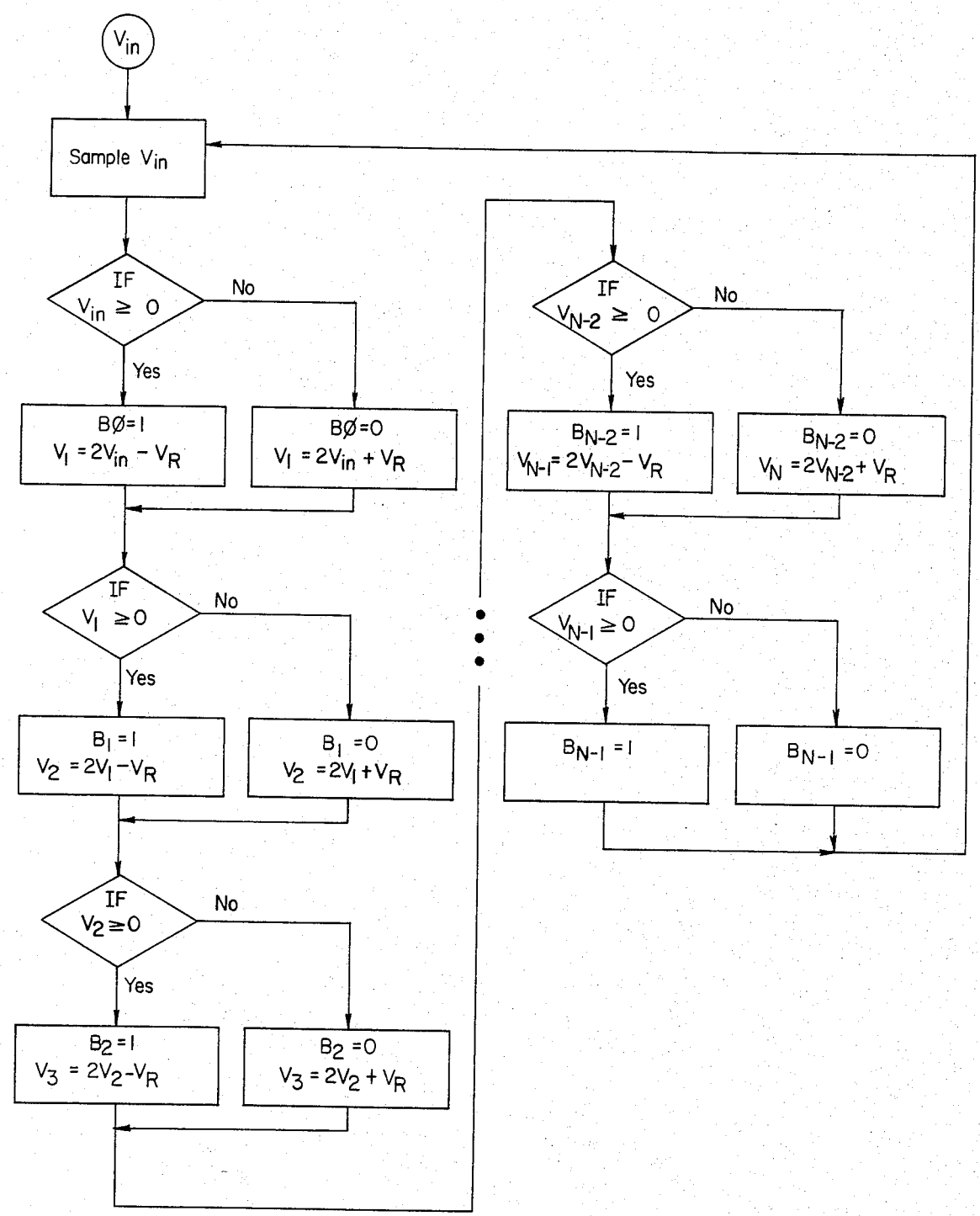
FIG. 1 is a flowchart of the successive-approximation analog-to-digital converter (ADC) function algorithm in accordance with which the present invention operates.

In FIG. 1, there is presented a flowchart of an algorithm for an iterative analog-to-digital converter. Identified in the flowchart of FIG. 1 are the basic operations in executing a successive-approximation scheme of analog-to-digital conversion.

In performing analog-to-digital conversion by successive approximation, one basic operation is an analog processing function in which a new voltage is formed that is two times a previous voltage, and adding or subtracting a refence voltage depending upon the sign (+ or −) of the previous voltage. Another basic operation in the algorithm is a comparison of the new voltage to determine whether or not it is greater than or equal to zero, and for producing a binary digit value output depending upon the result of the comparison. For an N-bit A/D converter, the analog processing and comparator functions are repeated N times.

As stated, the analog processing operation in the algorithm involves producing a voltage which is two times the previous output voltage. This operation is referred to herein as a "times two" function.

In the flowchart of FIG. 1, the conversion is of an input voltage designated by the notation "$V_{in}$". The first operation is the sampling of $V_{in}$. When a sample is obtained, a comparison is made to determine whether or not $V_{in}$ is greater than or equal to zero. If the comparison indicates that the input voltage is positive (i.e., the answer is YES), then bit $\emptyset$ is set as a logic 1 (B$\emptyset$=1). Additionally, analog processing of $V_{in}$ is undertaken to develop a voltage $V_1$ which is equal to two times $V_{in}$ minus a reference voltage designated $V_R$. On the other hand, if $V_{in}$ is a negative voltage (i.e., the result of the comparison is NO), then bit $\emptyset$ is established as a logic 0, and the analog processing of $V_{in}$ is undertaken to form a new voltage $V_1$ which is equal to two times $V_{in}$ plus the reference voltage $V_R$. After the appropriate analog processing, a comparison of the new voltage $V_1$ is made. The processing continues until the voltage $V_{N-1}$ is resolved into the last binary digit (i.e., bit $B_{N-1}$). The algorithm then starts over by directing that a new input voltage sample be obtained.

From the flowchart in FIG. 1, it will be observed that to implement an algorithmic analog-to-digital converter apparatus in accordance therewith, means must be provided for resolving a voltage level into a binary digit value, and for providing an output signal indicative thereof. Additionally, means must be provided for accomplishing the "times two" function and for adding or subtracting a reference voltage. The means for resolving a voltage level into a binary digit value is readily implemented by a comparator circuit. In accordance with the present invention, the "times two" function is realized by adding a previous voltage level V to itself to provide a voltage level of 2 V. That is, the times two function involves doing a one-plus-one addition.

Further in accordance with the present invention, the process of repeatedly adding a previous voltage to itself is accomplished by a recycling integrator in combination with a means for storing a previous voltage level. In the recycling integrator, a previous voltage level V(N−X) is established on a capacitor. An identical voltage is established and held by voltage level storing means. The stored voltage is then transferred to the integrator. With the "times two" voltage established on the integrator, a reference voltage is then either added to or subtracted from that voltage by further integrating a positive or a negative voltage. The new voltage V(N−X+1) is resolved into a binary digit value, and then becomes the "previous" voltage level for purposes of processing in the recycling integrator to form the next new voltage V(N−X+2).

II. Recycling Unity Gain Buffer

Figure 2:
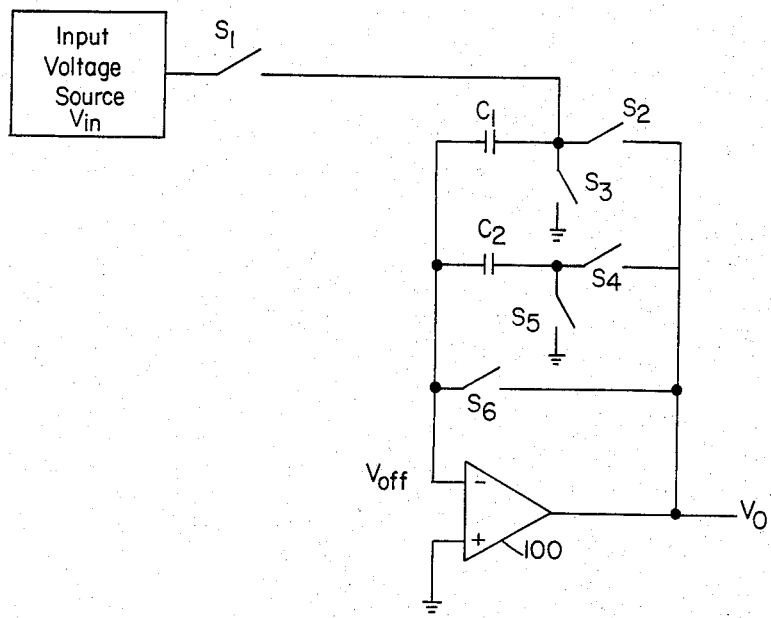
FIG. 2 is a schematic diagram of an implementation of the recycling unity gain buffer apparatus in accordance with one aspect of the present invention.

The recycling integrator function is preferably implemented using the recycling unit gain buffer circuit diagrammed in FIG. 2. An understanding of this circuit will facilitate discussion of the analog-to-digital converter circuits diagrammed in FIGS. 7 and 10.

With reference to FIG. 2, the circuit diagrammed therein includes an operational amplifier 100. The non-inverting input of op-amp 100 is grounded. Connected between the inverting input and the output is an arrangement of capacitors and switches. As indicated in the diagram of FIG. 2, an input voltage $V_{in}$ is coupled into the circuit through a switch S1.

Figure 3:
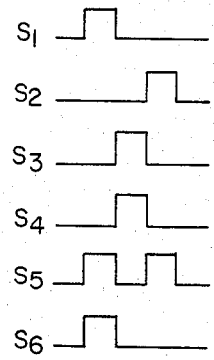
FIG. 3 is a timing diagram of switch actuations in the circuit diagrammed in FIG. 2, for producing a voltage recycling function.
Figure 4:
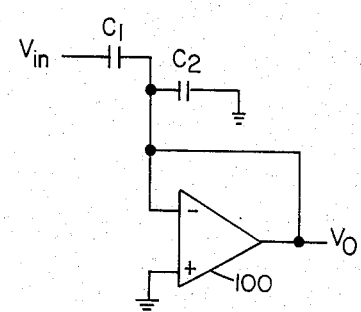
FIGS. 4, 5 and 6 are diagrams of equivalent circuits of that in FIG. 2 at various stages of operation as defined by the timing diagram of FIG. 3.
Figure 5:
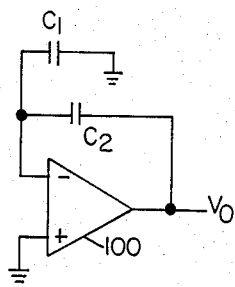
Figure 6:
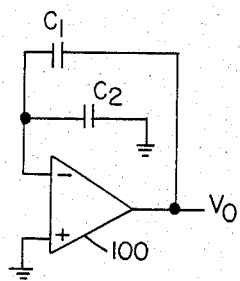

The timing diagram presented in FIG. 3 illustrates one sequence of operation of the recycling unity gain buffer circuit of FIG. 2. In FIGS. 4, 5 and 6, shown are circuits corresponding to configurations of the buffer circuit at various stages of operation.

Considering the diagrams of FIGS. 2-6, operation of the recycling unity gain buffer circuit proceeds with switch S1 being closed to apply the input voltage to capacitor C1. Simultaneously, switches S5 and S6 are closed. This configures the circuit as shown in FIG. 4. By reason of the closure of switch S5, capacitor C2 is charged to the offset voltage of the op-amp.

In a switched-capacitor circuit, conservation of charge is the fundamental principle. Accordingly, the total charge in the circuit of FIG. 4 after S1 is opened is given by the equation:

$$Q_{t4} = C1(V_{in} - V_o) + C2(-V_o) \quad (1)$$

(where op-amp 100 output voltage $$V_o = -\frac{A}{1+A} V_{off}$$

with A being the DC, open-loop gain of the op-amp and $V_{off}$ being the op-amp offset voltage)

At the next stage of operation, when switches S1, S5 and S6 are opened, switches S3 and S4 are closed. This configures the circuit as shown in FIG. 5. In this configuration, the charge on capacitor C1 is transferred to capacitor C2.

The total charge in the circuit at this point is given by the equation:

$$\begin{aligned} Q_{t5} &= C_2(V_o - V) + C_1(-V) \\ &= C_2 V_o - (C1 + C2) V \end{aligned} \quad (2)$$

$$\left( \text{where } V = \frac{-V_o}{A} - V_{off} \right)$$

$$= C_2 V_o + \left( \frac{V_o}{A} + V_{off} \right)(C1 + C2)$$

Accordingly, to charge conservation law, $Q_{t4} = Q_{t5}$. Therefore, setting equations (1) and (2) equal to one another and reducing through algebraic manipulation, equation (3) results as follows:

$$\left( C2 + \frac{C1 + C2}{A} \right) V_o = C1 \, V_{in} - (C1 + C2) \frac{V_{off}}{1+A} \quad (3)$$

Solving for $V_o$ yields:

$$V_o = \frac{C1}{C2} \cdot \frac{1}{1 + \frac{1}{A} + \frac{C1}{C2} \cdot \frac{1}{A}} V_{in} - \quad (4)$$

$$\frac{A(C1 + C2)}{(C1 + C2 + AC2)(1 + A)} \cdot V_{off}$$

If $C1 \simeq C2$, then the following can be derived from (4):

$$V_o \simeq \frac{C1}{C2} \cdot \frac{1}{1 + 2/A} V_{in} - \frac{2}{A} V_{off} \quad (5)$$

If A is on the order of 1000, or greater, then equation (5) reduces to:

$$V_o \simeq \frac{C1}{C2} V_{in} \quad (6)$$

Essentially, therefore, the voltage on C2 can be regarded as that given by the following equation:

$$V_o = V_{C2} = \frac{C_1}{C_2} V_{in} \quad (7)$$

At the next state of operation, switches S2 and S5 are closed to configure the circuit as shown in FIG. 6. In this circuit arrangement, the voltage on capacitor C2 is transferred back to capacitor C1. The voltage on capacitor C1, and thus the output voltage $V_o$, is given by the following equation:

$$V_o = V_{C1} = \frac{C_2}{C_1} \left( \frac{C_1}{C_2} V_{in} \right) = V_{in} \quad (8)$$

Therefore, the capacitor ratios cancel through the recycling process, which leaves the output voltage equal to the original input voltage. Additionally, there has been compensation for the offset voltage of op-amp 100. There is, therefore, provided by the circuit shown in FIG. 2 a perfect unity gain applied to the input voltage.

III. Switched Capacitor A/D Converter Apparatus

Figure 7:
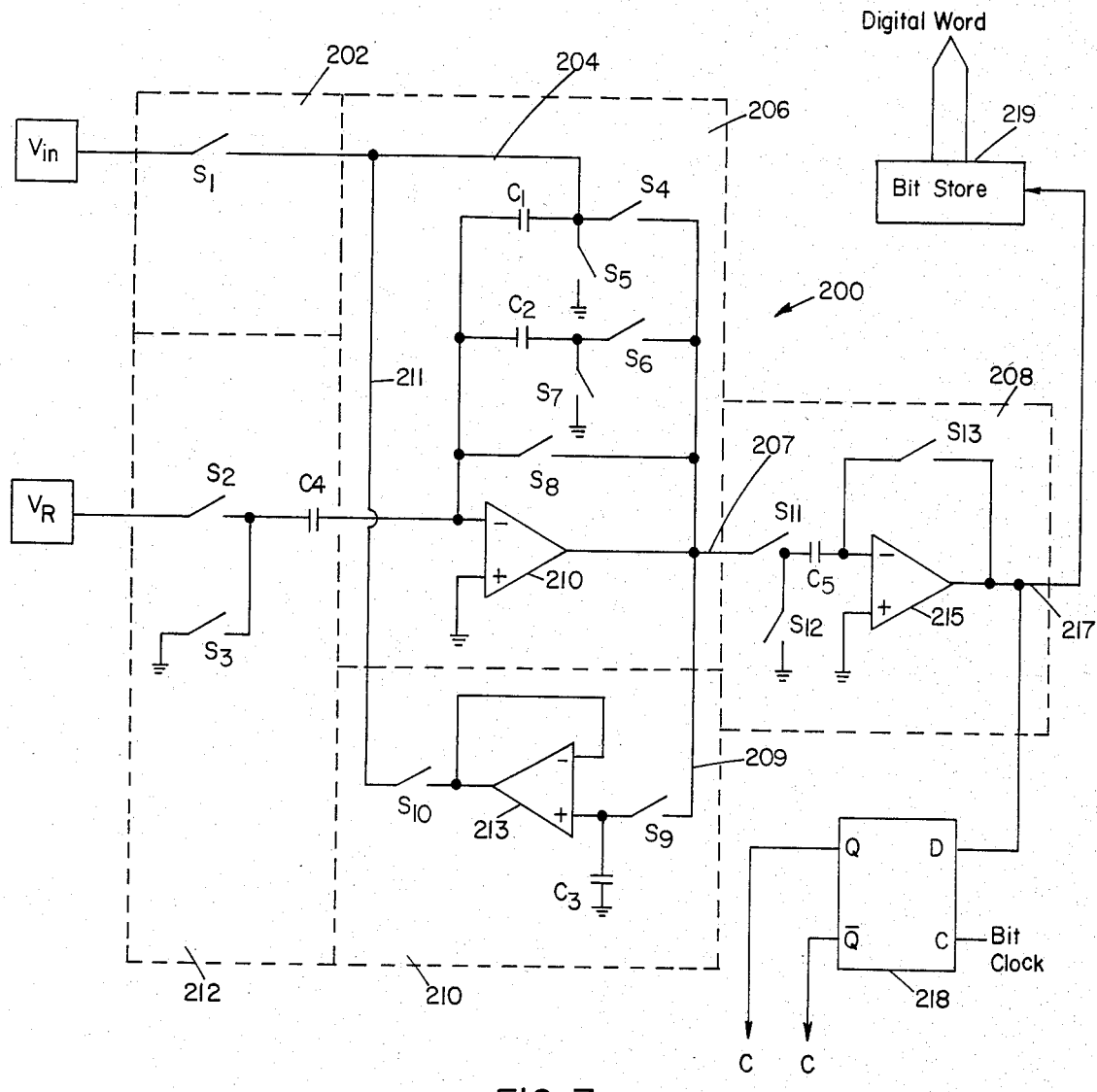
FIG. 7 is a schematic diagram of one embodiment of a switched-capacitor circuit ADC in accordance with the present invention, and in which the "times two" analog processing is by a recycling integrator.

Referring now to FIG. 7, there is diagrammed circuitry for implementing an analog-to-digital converter which operates in accordance with the algorithm flowcharted in FIG. 1. Additionally, the A/D converter embodies the "times two" function aspect of the present invention, wherein a previous voltage is added to itself. Further, the apparatus diagrammed in FIG. 7 utilizes the recycling unity gain buffer circuit of FIG. 2 as a recycling integrator.

In FIG. 7, an input voltage source is accessed by means 202 to provide an input voltage sample. The input voltage source may be either a sample-and-hold circuit or it may be a conductor carrying thereon a continuous analog signal. Switch S1 couples the input voltage source signal onto conductor 204, which serves as the input to the recycling integrator 206. The recycling integrator includes op-amp 210; capacitors C1 and C2; and switches S4, S5, S6, S7 and S8. The output of recycling integrator 206 is applied to comparator 208 and delay circuit 210 over conductors 207 and 209, respectively.

A/D converter 200 further includes a means for providing a reference voltage level $V_R$ of either + or − polarity. The reference voltage source 212 includes a switch S2 which selectively couples the reference voltage to capacitor C4. Additionally, function block 212 includes switch S3 for selectively connecting capacitor C4 to ground potential.

Figure 8:
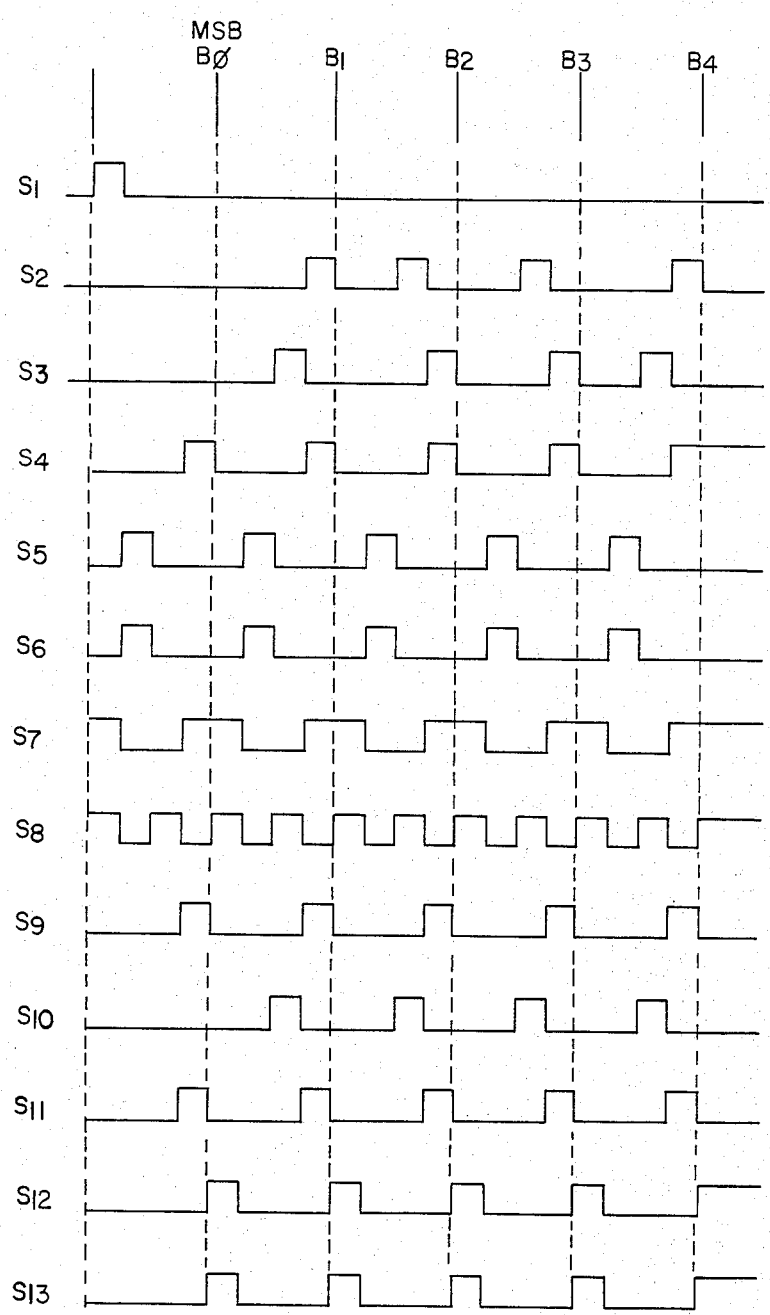
FIG. 8 is a timing diagram illustrating switch actuations in the circuit of FIG. 7, for providing an ADC function in accordance with the flowchart of FIG. 1.
Figure 9:
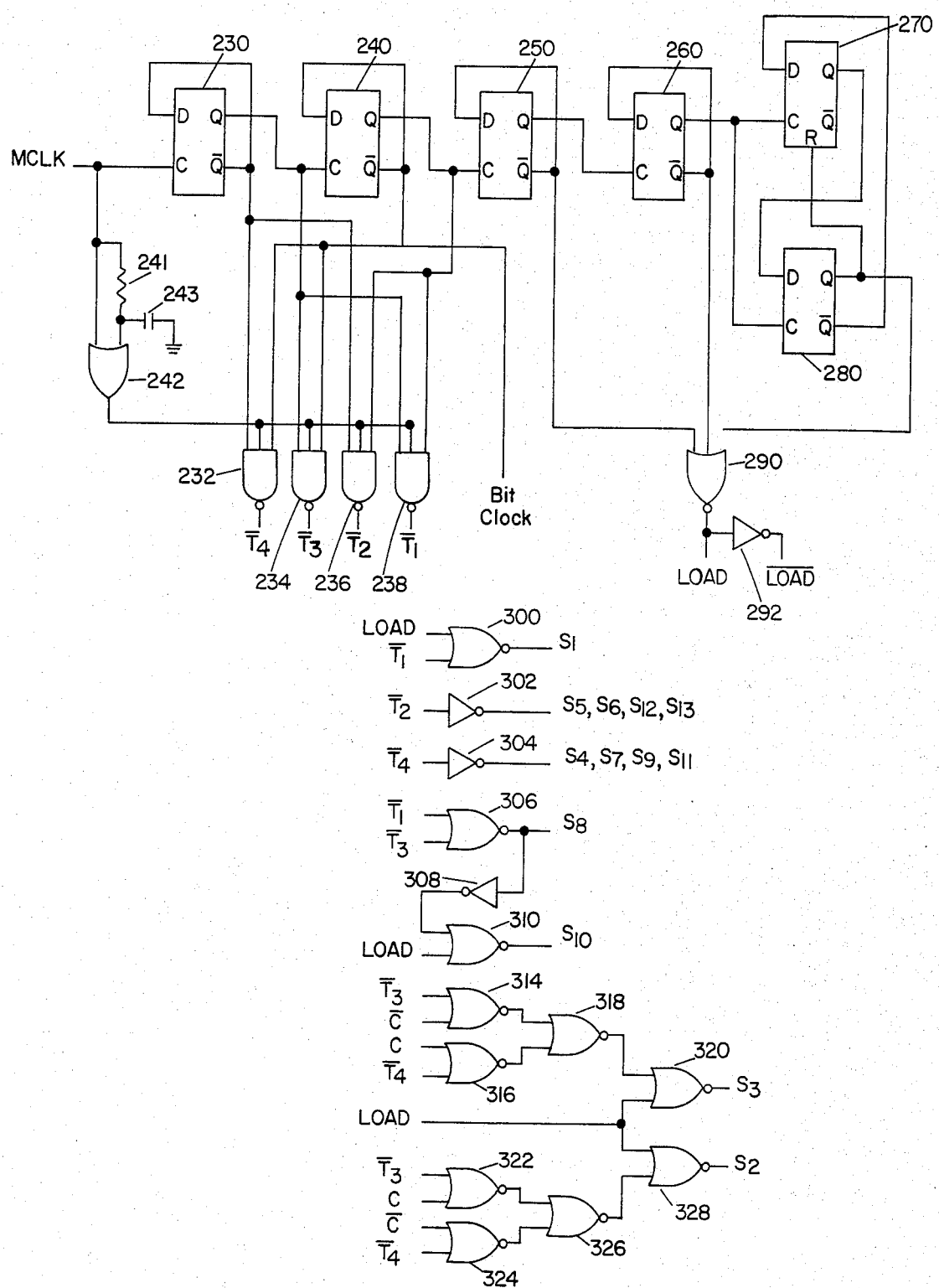
FIG. 9 is a schematic diagram of digital logic circuits for generating the switch actuation signals shown in FIG. 8.

Referring to FIG. 8, there is presented a timing diagram which illustrates the switch actuations required in operating the circuitry of FIG. 7 to realize analog-to-digital conversion. With reference to FIG. 9, there is diagrammed digital logic circuitry for generating the switch actuation signals.

Considering now FIGS. 7 and 8, in operation of A/D converter 200, switch S1 is closed to provide the input voltage sample to recycling integrator 206. As indicated in the timing diagram of FIG. 8, when switch S1 is closed, switches S7 and S8 are also closed. This causes capacitor C1 to be charged to a voltage level equal to the input voltage minus the offset voltage of op-amp 210. Capacitor C2 is charged to the offset voltage level. Next, switches S5 and S6 are closed and all others opened. This results in the voltage on capacitor C1 being transferred to capacitor C2. In the next step in the operation, only S8 is closed in order to refresh the offset voltage at the input of op-amp 210. Switches S4 and S7 are then closed to transfer the voltage on capacitor C2 back onto capacitor C1. The output voltage available from op-amp 210 over line 207 to comparator 208 and over line 209 to delay circuit 210 is the input voltage amplified by a perfect unity gain. Further, the voltage is independent of capacitor ratios and op-amp offset voltage.

The voltage available at the output of op-amp 210 is then stored in delay circuit 210. Delay circuit 210 shown in FIG. 7 is a sample-and-hold circuit comprising switch S9, storage capacitor C3 and buffer amplifier 213. Voltage is stored in the sample-and-hold circuit by closure of switch S9, placing the op-amp output voltage on C3. The voltage stored in the sample-and-hold delay circuit is selectively made available therefrom by switch S10 and over conductor 211 to conductor 204 of the recycling integrator circuit.

The output voltage of op-amp 100 is further applied to comparator 208 by closure of switch S11, which places the voltage on capacitor C5. As indicated in the timing diagram of FIG. 8, after switch S11 in comparator 208 opens, switches S12 and S13 are closed. This configures op-amp 215 as a comparator. The voltage stored on capacitor C5 is compared to ground potential to determine whether the voltage is positive or negative. The result of the comparison, which is indicated as either a logic 1 or a logic 0, is made available over conductor 216 to flip-flop 218. An appropriately timed bit clock pulse applied to the clock input of flip-flop 218 stores the bit value of the comparison. Available from the Q and $\bar{Q}$ outputs of flip-flop 218 are the signals C and $\bar{C}$ which are utilized in the logic circuitry diagrammed in FIG. 9. The output of comparator 208 is further made available over conductor 217 for entry into a shift register or other means 219 for storing the bit value determinations.

At the same time comparator 208 is in operation, switches S7 and S8 in the recycling integrator are again closed. Closure of these two switches results in the voltage on capacitor C1 being reduced by the operational amplifier offset voltage, and capacitor C2 being charged to the offset voltage level. Subsequent closure of switches S5 and S6 as indicated in the timing diagram causes the voltage on capacitor C1 to be transferred to capacitor C2. Switch S8 is closed to refresh the offset voltage. Simultaneously, switch S10 in delay circuit 210 is closed. This results in capacitor C1 integrating charge up to the voltage level stored on capacitor C3. Next, switches S4 and S7 are closed to transfer to C1 the voltage on capacitor C2, which is equal to the voltage stored on capacitor C3. This, of course, results in a voltage on C1 that is double the previous voltage. Since the previous voltage was equal to $V_{in}$, the new voltage on capacitor C1 is $2V_{in}$. Accordingly, a "times two" function has been achieved.

As further required by the successive-approximation algorithm flowcharted in FIG. 1, based upon the resolution by comparator 208 of the previous voltage into a binary digit value, the reference voltage must be either added to or subtracted from the "new" voltage on capacitor C1. Assuming the previous voltage output from the recycling integrator was positive, the output of comparator 208 would be a logic 1. Thus, the reference voltage $V_R$ should be subtracted from the "times two" voltage on capacitor C1.

The adding or subtracting of $V_R$ is controlled by the sequence of switch closures for switches S2 and S3. To subtract $V_R$ from the voltage on C1, switch S3 is first closed. Simultaneously, switch S8 is closed. This clears capacitors C4. Thereafter, S3 is opened and switch S2 is closed. This results in a negative reference voltage being integrated onto capacitor C1, which effectively subtracts $V_R$ from $2V_{in}$.

To add the reference voltage to the "times two" voltage on capacitor C1, the sequence of switch closures for switches S2 and S3 is reversed. That is, switch S2 is first closed to charge capacitor C4 to the reference voltage level. Subsequently, switch S3 is closed. This results in the positive reference voltage on capacitor C4 being transferred to capacitor C1. Effectively, the reference voltage is added to the "times two" voltage on capacitor C1.

The voltage on capacitor C1 is then applied to comparator 208 and delay circuit 209, and for purposes of the next bit determination, it becomes the previous voltage which undergoes the "times two" processing in recycling integrator 206.

The above discussion carries operation of the A/D converter apparatus 200 through the resolution of only two bits, the most significant bit (MSB) and the next lower ordered bit. The analog processing and comparison operations continue repeatedly until the last bit to be resolved is obtained. Thereafter, switch S1 is actuated to bring in a new input voltage sample for conversion. Also, the pattern of switch S2 and S3 closures diagrammed in FIG. 8 represents operation in which the sequence of output bits B∅ through B3 is "1010".

With reference to FIG. 9, digital logic for generating the required switch actuation signals for use in FIG. 7 is diagrammed. As indicated, a master clock signal designated MCLK is applied to a group of flip-flops designated by the reference numerals 230, 240, 250, 260, 270 and 280. The outputs of flip-flops 230 and 240 are applied to NAND gates 232, 234, 236 and 238. An additional input to these gates is the output of OR gate 242 which is configured as a timed one-shot device utilizing the RC timing network of resistor 241 and capacitor 243. The outputs of the NAND gates provide the non-overlapping clock signals of $\bar{T}_1$, $\bar{T}_2$, $\bar{T}_3$, and $\bar{T}_4$. Additionally the $\bar{Q}$ output of flip-flop 240 provides the bit clock signal which is applied to flip-flop 218 in FIG. 7. The outputs of flip-flops 250, 260, and 280 are applied as inputs to NOR gate 290 to generate the Load signal. Inverter 292 inverts the output of NOR gate 290 to provide the $\overline{Load}$ signal.

The various $\bar{T}$ clock signals, the Load and $\overline{Load}$ signals are applied as input signals to logic comprising a number of gates to produce the switch actuation signals. NOR gate 300 produces the switch S1 actuation signal. Inverter 302 provides the actuation signal for switches S5, S6, S12 and S13. Inverter 304 provides the switch actuation signal to S4, S7, S9 and S11. NOR gate 306 provides the switch S8 actuation signal. Furthermore, the output of NOR gate 306 after inversion by inverter is applied as an input to NOR gate 310 to produce the switch S10 actuation signal. Logic comprising NOR gates 314, 316, 318, 320, 322, 324, 326 and 328 provide the actuation signals for switches S2 and S3. To be noted also is that the signals C and $\bar{C}$ from flip-flop 218 in FIG. 7 are applied as inputs to NOR gates 314, 316, 322 and 324.

IV. Switched Capacitor A/D Converter Apparatus Utilizing Recycling Unity Gain Buffer Delay Circuit The sample-and-hold circuit implementing delay circuit 210 in the apparatus of FIG. 7 has significant offset voltage on the operational amplifier 213. The effect of the offset voltage is that a "dead band" is created in the transfer function of the A/D converter apparatus. The dead band produces nonlinear distortion which limits the dynamic range in the analog-to-digital conversion. In order to obviate the dead band, the delay function is implemented using the recycling unity gain buffer circuit previously described.

Figure 10:
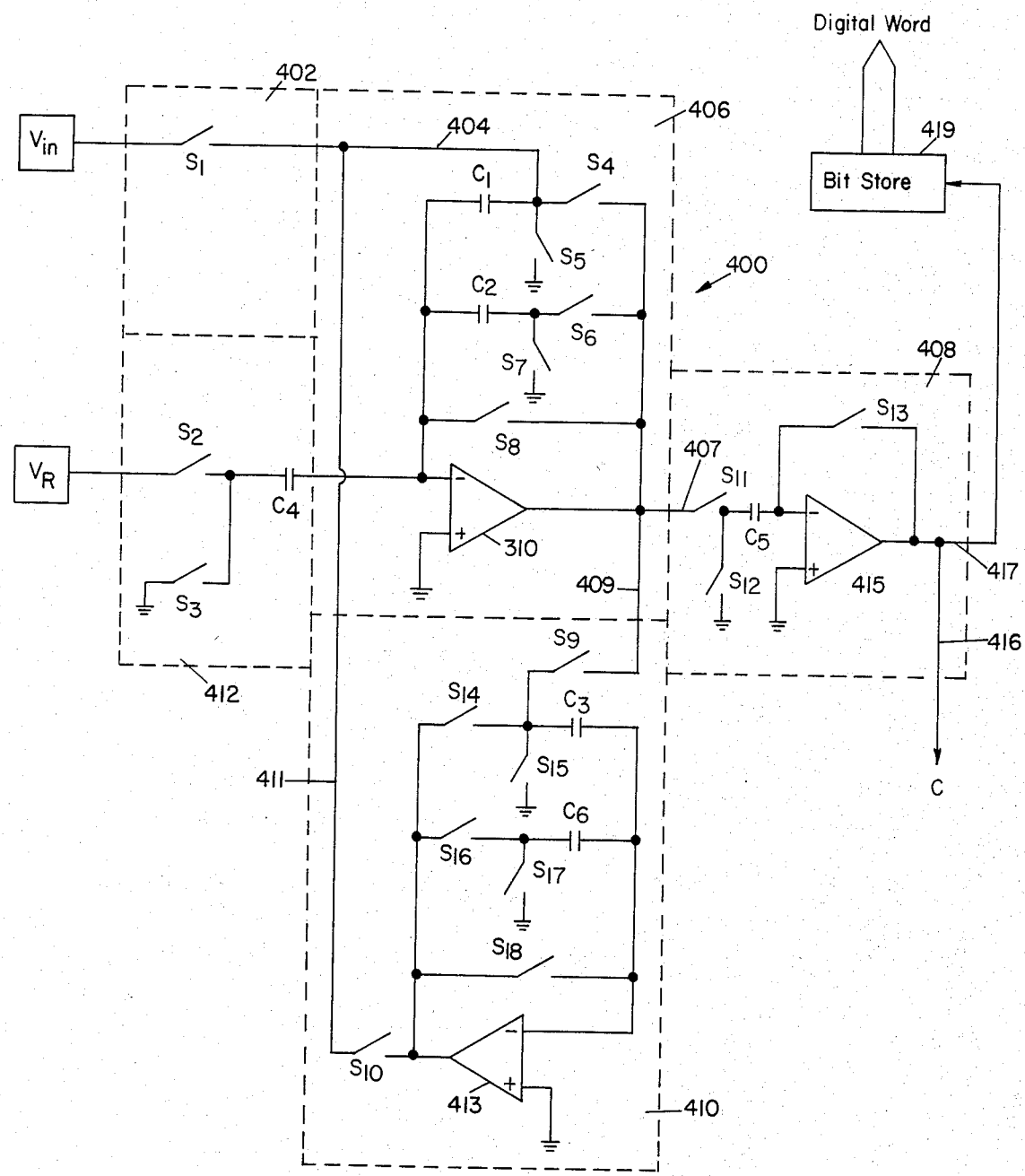
FIG. 10 is a schematic diagram of a second embodiment of a switched-capacitor circuit ADC in accordance with the present invention, and in which the "times two" analog processing is by a recycling integrator and the delay function is provided by a recycling unity gain buffer.

The recycling unity gain buffer circuit works as a delay circuit because it recycles, and thus delays and stores, the voltage level used in the previous bit resolution. A schematic diagram of A/D converter apparatus 400 utilizing the recycling unity gain buffer circuit as a delay circuit is shown in FIG. 10. Other than the substitution of the recycling unity gain buffer circuit for the sample-and-hold circuit, apparatus 400 is the same as apparatus 200 in FIG. 7.

Figure 11:
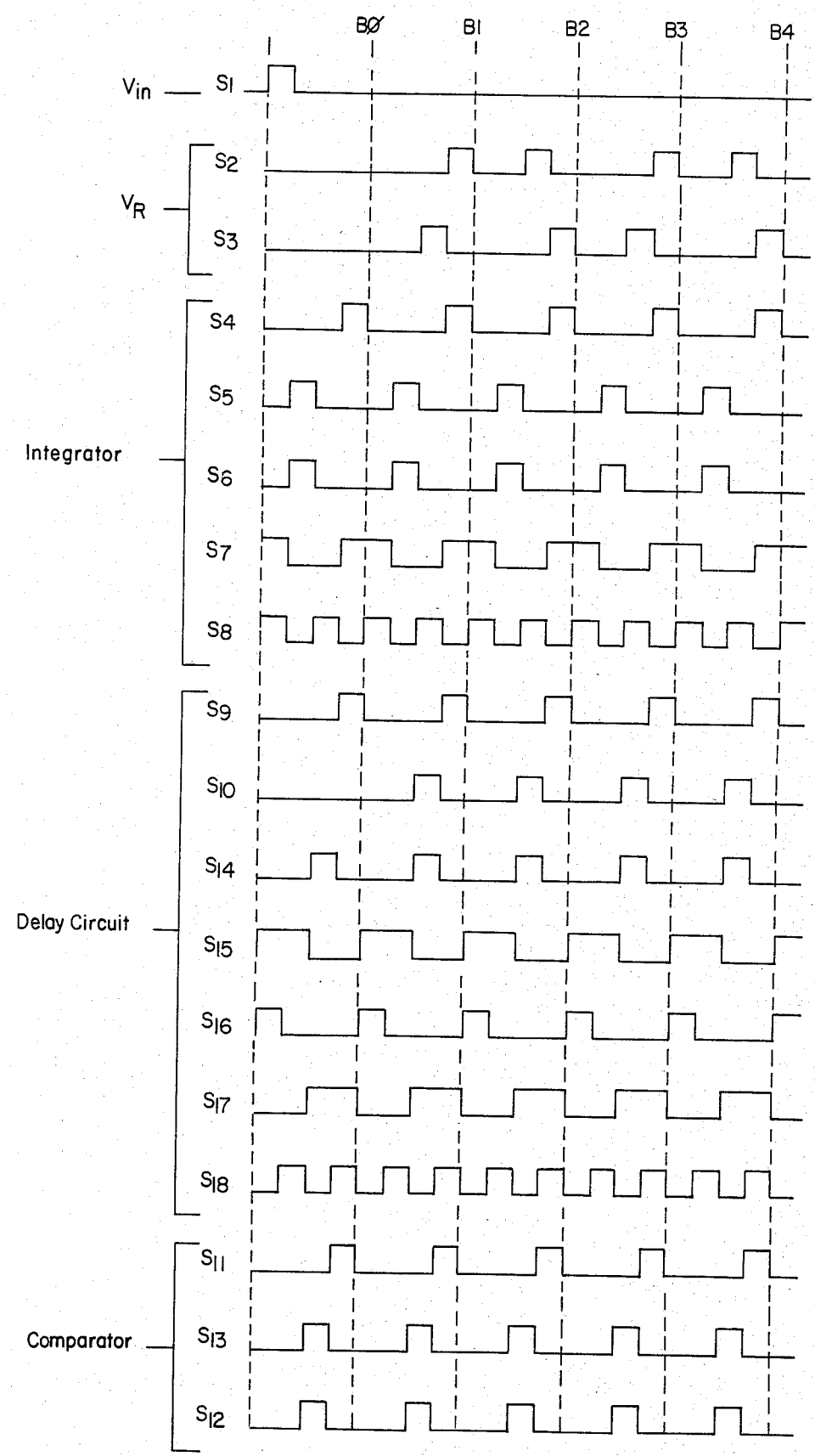
FIG. 11 is a timing diagram illustrating switch actuations in the circuit of FIG. 7, for providing an ADC function in accordance with the flowchart of FIG. 1.
Figure 12:
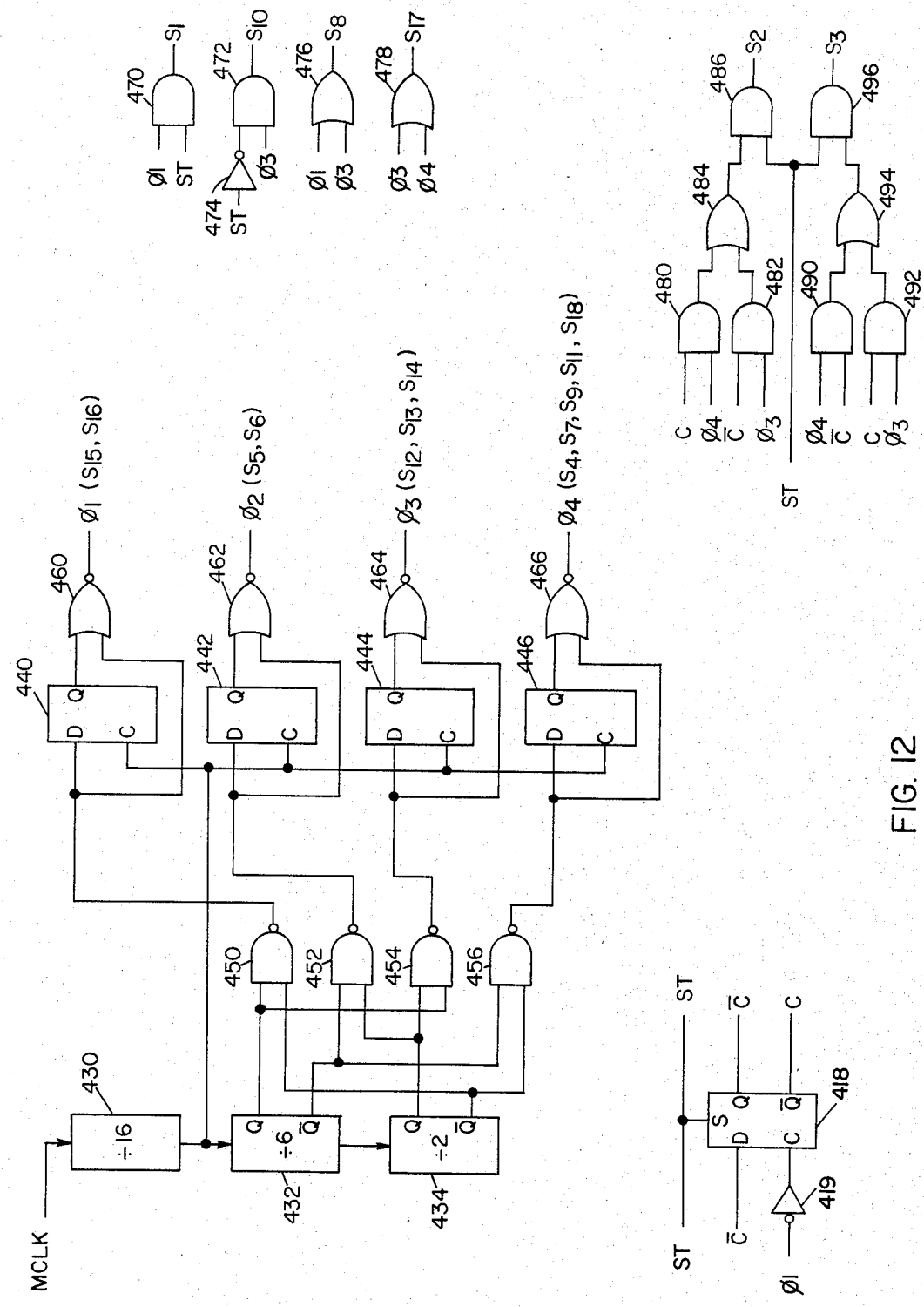
FIG. 12 is a schematic diagram of digital logic circuit for generating the switch actuation signals shown in FIG. 8.

In FIG. 11, there is presented a timing diagram for the A/D converter apparatus shown in FIG. 10. In FIG. 12, digital logic circuitry is diagrammed for producing the switch actuation signals indicated in the timing diagram.

The overall operation of A/D apparatus 400, as reflected by the timing diagram in FIG. 11, is identical to that of apparatus 200 in FIG. 7. Accordingly, only the operation of delay circuit 410 requires description. The operation of delay circuit 410 commences when a new voltage for resolution by comparator 408 is made available from recycling unity gain integrator 406. The new voltage is made available to delay circuit 410 over conductor 409 and through closure of switch S9. As shown in the timing diagram, contemporaneous with the closing of switch S9 is the closure of switches S17 and S18. This results in the output voltage of integrator 406 minus the offset voltage of op-amp 413 being stored on capacitor C3. Also, the op-amp offset voltage is stored on capacitor C6. Next, switches S15 and S16 are closed. Whereupon the voltage on capacitor C3 is transferred to capacitor C6. The values of capacitors C3 and C6 are identical. Thus, the multiplying capacitor ratio is unity. Additionally, because the op-amp offset voltage is stored on C6, compensation therefor is accomplished. The voltage then established on capacitor C6 is exactly equal to the voltage which was output from integrator 406. The operation of circuit 410 continues with switches S14, S17 and S10 being closed. Closure of switches S14 and S17 causes the voltage on capacitor C6 to be transferred to capacitor C3. Closure of switch S10 results in the voltage being output from delay circuit 410 over conductor 411 which applies the voltage to conductor 404 in integrator 406. The operation of the delay circuit then starts over again with the closure of switches S9 and S18, and the continued closure of switch S17.

Referring now to FIG. 12, the logic circuitry for producing the switch actuation signals for use in the circuitry diagrammed in FIG. 10 operates from a master clock signal designated MCLK. This clock signal is applied to a series of devices for dividing down MCLK. These devices include divide-by-16 device 430, divide-by-6 device 432, and divide-by-2 device 434. The output of device 430 is applied as a clock input to flip-flops 440, 442, 444 and 446. The D inputs to these flip-flop devices are obtained from NAND gates 450, 452, 454 and 456. The inputs to these gates are obtained from the Q and $\overline{Q}$ outputs of devices 432 and 434.

The non-overlapping clocks designated $\emptyset 1$, $\emptyset 2$, $\emptyset 3$ and $\emptyset 4$ are obtained from NOR gates 460, 462, 464 and 466. The $\emptyset 1$ clock is used directly to provide the switch actuation signal for switches S15 and S16. Similarly, the $\emptyset 2$ clock is directly used to actuate switches S5 and S6. The $\emptyset 3$ clock actuates switches S12, S13 and S14. The $\emptyset 4$ clock provides the actuation signal for switches S4, S7, S9, S11 and S18.

The actuation signal for switch S1 is obtained from AND gate 470 which receives the $\emptyset 1$ clock and an operation starting pulse designated ST. The starting pulse is externally generated. The actuation signal for switch S10 is produced by AND gate 472 from the input signals of the $\emptyset 3$ clock and the output of inverter 474. The actuation signal for switch S8 is generated by OR gate 476, and the actuation signal for switch S17 is obtained from OR gate 478.

In order to generate the actuation signal for switch S2, AND/OR logic comprising AND gates 480 and 482 and OR gate 484 is utilized. The output of this logic circuitry and the starting pulse ST are applied as inputs to AND gate 486 to generate the switch S2 actuation signal. The actuation signal for switch S3 is generated in a similar fashion. The AND/OR logic includes AND gates 490 and 492 and OR gate 494. The starting pulse ST and the output of OR gate 494 are applied as inputs to AND gate 496 to produce the switch S3 actuation signal.

Inputs to the AND/OR logic used in generating the S2 and S3 actuation signals include the C and $\overline{C}$ signals available from flip-flop 418 which is clocked by the output of inverter 419. The D input of flip-flop 418 receives the $\overline{C}$ signal from comparator 408 in FIG. 10. Flip-flop 418 can be preset by the starting pulse ST.

V. Alternate Embodiment of Switched Capacitor A/D Converter Apparatus

Figure 13:
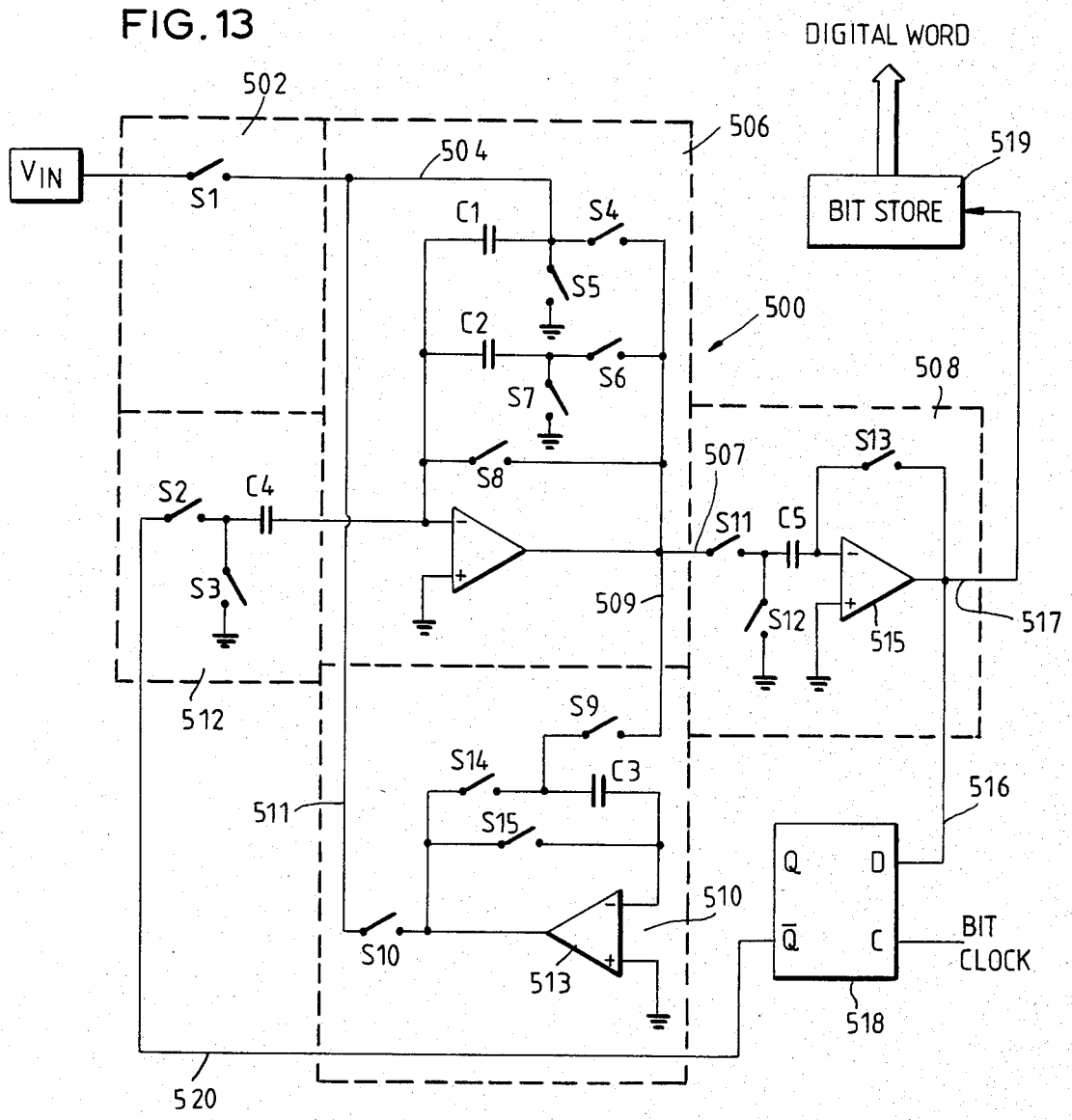
FIG. 13 is a schematic diagram of a third embodiment of a switched-capacitor ADC in accordance with the present invention in which the timing for the recycling integrator is altered from that for the circuits in FIGS. 7 and 10, and in which a different offset compensated unity gain buffer circuit is used to provide the delay function.
Figure 14:
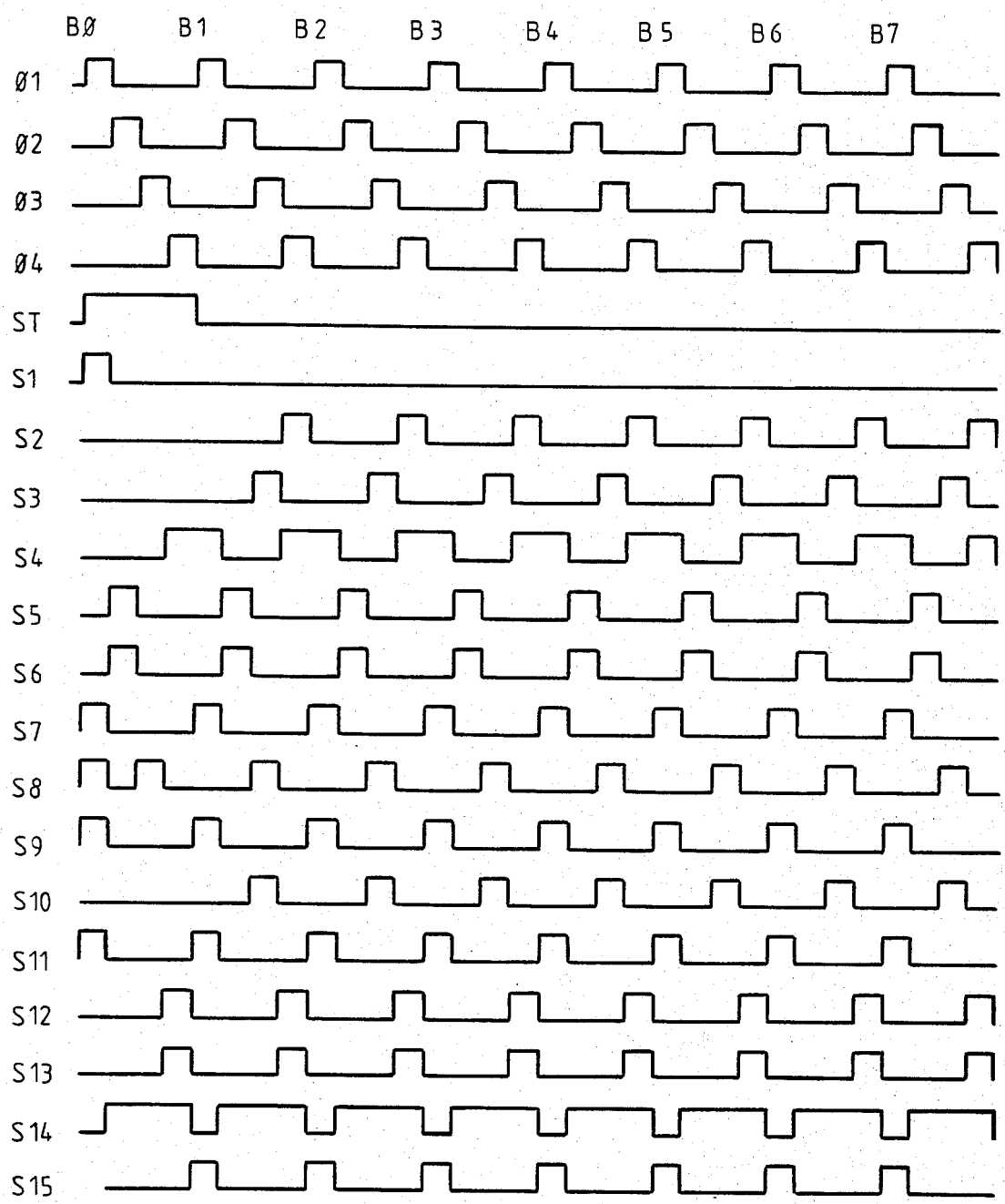
FIG. 14 is a timing diagram illustrating switch actuations in the circuit of FIG. 13, for providing an ADC function in accordance with the flowchart of FIG. 1.

The A/D converter apparatus shown in FIGS. 7 and 10 accomplish the analog processing function of $2V_{(N-1)} \pm V_R$ by integrating the voltage $V_{(N-1)}$ and $\pm V_R$ onto C1 at the same time. There is the possibility that C1 will get $2V_{(N-1)}$ first and then $2V_{(N-1)} \pm V_R$ later. This is because of the difference in delay through the respective conducting paths. The maximum magnitude of $2V_{(N)}$ in the conversion process is $2V_R$. In order to prevent saturation of the op-amp in the recycling integrator, $2V_R$ must be limited to less than one-half of the linear range of the op-amp. The circuit in FIG. 13 is provided with different timing, and accordingly a different operating sequence, so that C1 will get a maximum voltage of the $V_R$ rather than $2V_R$. This effectively doubles the dynamic range of the recycling integrator. The timing for apparatus 500 in FIG. 13 is presented in FIG. 14.

The apparatus in FIG. 13 also employs a different offset compensated unity gain buffer delay circuit 510. This circuit comprises only a single capacitor C3 and switches S9, S14 and S15. The operation of circuit 510 is in accordance with the timing diagram in FIG. 14. As indicated, when a new voltage for resolution is made available by recycling integrator 506, switch S9 is closed, as is switch S15. This results in the output voltage of integrator 506 minus the offset voltage of op-amp 513 being stored on capacitor C3. Capacitor C3 initially has the op-amp voltage stored thereon by reason of the closure of switch S14 during the start pulse ST. Therefore, C3 actually has only the recycling integrator output voltage thereon. Next, switch S14 is closed and remains closed for three timing periods (i.e., during ∅2, ∅3 and ∅4. Switch S10 is closed during the middle of the time S14 is closed, thereby making the voltage on C3 available over conductor 511 to conductor 504 in integrator 506.

A third aspect of the circuit in FIG. 13 that distinguishes it from that of FIGS. 7 and 10 concerns the manner in which the reference voltage $V_R$ is provided. As shown, the $\overline{Q}$ output of the flip-flop 518, a fixed voltage level at one of two voltage levels, is provided over conductor 520. Switch S2 controls application of the voltage to capacitor C4, which also has switch S3 connected to it. Switches S2 and S3 are alternately closed in the manner shown in FIG. 14. Also, preferably, C4=0.7 C1.

Figure 15:
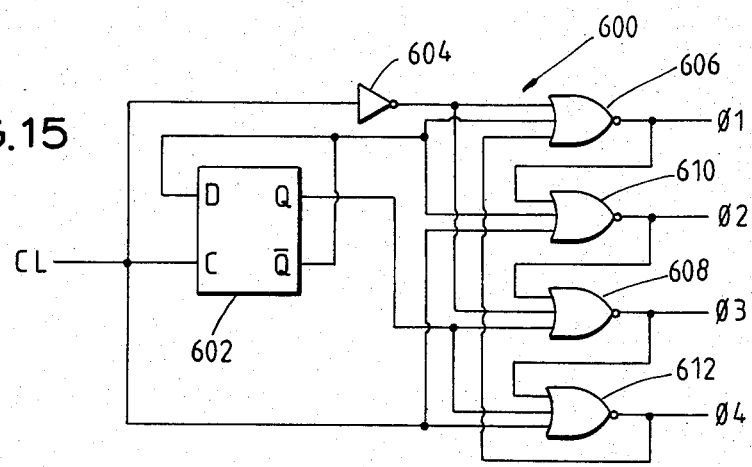
FIG. 15 is a schematic diagram of a digital logic circuit for providing the non-overlapping, four phase clocks $\emptyset 1$, $\emptyset 2$, $\emptyset 3$ and $\emptyset 4$ used to generate the switch timing and actuation signals in FIG. 14.

In order to generate the non-overlapping clocks ∅1, ∅2, ∅3 and ∅4, the circuit in FIG. 15 is used. This circuit 600 includes a D-type flip-flop 602 connected to "toggle," and thereby produce at the Q and $\overline{Q}$ outputs clocks at one-half the frequency of the input clock CL. The input clock CL is inverted by inverter 604 and applied to NOR gates 606 and 608. Clock CL is applied directly to NOR gates 610 and 612. The Q and $\overline{Q}$ outputs of flip-flop 602 are applied to gates 608 and 612, and to gates 606 and 610, respectively. The output of each gate is further used as an input to the gate producing the next clock phase.

Preferably, the analog-to-digital converter apparatus, the recycling unity gain integrator circuit, and the recycling unity gain buffer circuit shown variously in FIGS. 2–12 are fabricated in integrated circuits (either custom or semi-custom chips) using switched-capacitor technology. For example, the forementioned circuits may be realized using the uncommitted switched-capacitor circuit building block array disclosed in pending U.S. application Ser. No. 451,952, filed Dec. 21, 1982 by the inventors named herein and assigned to Racal-Vadic, Inc. Further, the variious switches shown in the schematic diagrams are preferably analog switch devices, such, for example, as the well-known MOS or CMOS switch devices.

The foregoing description of the invention has been directed to particular preferred embodiments for purposes of explanation and illustration. It will be apparent, however, to those skilled in this art that many modifications and changes in the structure shown may be made without departing from the essence of the invention. It is the Applicants' intention in the following claims to cover all equivalent modifications and variations as fall within the scope of the appended claims.

What is claimed is:

1. An amplifier circuit having input offset voltage compensation, comprising:
   an operational amplifier having an input and an output, the input being at an offset voltage level with respect to virtual ground;
   first and second capacitors connected to the amplifier input;
   first means for applying an input voltage signal level to the first capacitor to establish a voltage thereon equal to the input voltage minus the amplifier offset voltage, and for establishing the offset voltage level on the second capacitor;
   second means for causing the voltage on the first capacitor to be transferred to the second capacitor, so as to be added to the offset voltage established thereon; and
   third means for causing the voltage on the second capacitor to be transferred back to the first capacitor,
   whereby the operational amplifier produces an output voltage level functionally related to the input voltage signal level and independent of the amplifier input offset voltage.

2. The amplifier circuit of claim 1 wherein:
   the first and second capacitors are of substantially equal capacitance values.

3. The amplifier circuit of claim 1 or 2 further comprising:
   means for establishing a feedback loop between the operational amplifier input and output, to configure the operational amplifier as a buffer amplifier.

4. The amplifier circuit of claim 1 or 2 wherein:
   said first means comprises a first switch device connected between the first capacitor and an input voltage source, and a second switch device connected between the second capacitor and ground potential;
   said second means comprises a third switch device connected between the first capacitor and ground, and a fourth switch device connected between the second capacitor and the amplifier output; and
   said third means comprises a fifth switch device connected between the first capacitor and the amplifier output, and a sixth switch device connected between the second capacitor and ground potential.

5. Apparatus for developing a voltage output level that is two times a previously existing output voltage level, comprising:
   an integrator circuit having an input and an output, for producing an output voltage level;
   first means connectable to the integrator circuit input, for receiving and storing a voltage corresponding to a previously existing output voltage level;
   second means for accessing the integrator circuit output to obtain the output voltage level, and for storing the same as a previously existing voltage level;
   third means for causing the voltage stored in said first means to be transferred to the integrator circuit; and
   fourth means for causing the voltage in said second means to be transferred to the integrator circuit and be added to the voltage transferred from said first means.

6. The circuit of claim 5 wherein the voltage accessing and storing means comprises:
   a sample-and-hold circuit having an input and an output; and
   a switch for connecting the sample-and-hold circuit input to the amplifier output.

7. The circuit of claim 6 wherein the means for causing the transfer of the voltage in the sample-and-hold circuit comprises a switch for connecting the sample-and-hold circuit output to the integrating capacitor.

8. A switched-capacitor circuit for developing an output voltage level that is two times a previously existing output voltage level, comprising:
   an operational amplifier having an input and an output;
   an integrating capacitor connectable in a feedback loop between the amplifier input and output;

a storage capacitor connected to the integrating capacitor, for storing a voltage corresponding to a previously existing amplifier output voltage level;

means for accessing the amplifier output and storing the output voltage level as a previously existing amplifier output voltage level;

means for causing the voltage on the storage capacitor to be transferred to the integrating capacitor; and means for causing the voltage in the voltage storing means to be transferred to the integrating capacitor and be added to voltage transferred from the storage capacitor.

9. The circuit of claim 6 wherein the integrating capacitor and the storage capacitor are of equal capacitance values.

10. The circuit of claim 6 wherein the means for causing transfer of the storage capacitor voltage to the integrating capacitor comprises:

a switch connecting the integrating capacitor in the amplifier feedback loop; and a switch for connecting the storage capacitor to ground potential.

11. A switched-capacitor circuit for developing an output voltage level that is two times a previously existing output voltage level, comprising:

an operational amplifier having an input and an output, said amplifier producing an output voltage level;

a first capacitor connected to the amplifier input;

a second capacitor connected to the amplifier input, for storing a voltage corresponding to a previously existing amplifier output voltage level;

means for storing a voltage level applied thereto;

a first switch for connecting the first capacitor in a feedback loop between the amplifier input and output;

a second switch for connecting the second capacitor to ground potential;

a third switch for connecting the voltage level storing means to the amplifier output to obtain and store the amplifier output voltage level as a previously existing voltage level;

a fourth switch for connecting the voltage level storing means to the first capacitor; and means for controlling said switches to (i) cause the voltage stored on the second capacitor to be transferred to the first capacitor, (ii) cause the voltage stored in the voltage level storing means to be transferred to the first capacitor and be added to the voltage transferred from the second capacitor, and (iii) cause the amplifier to produce on output voltage corresponding to the voltage on the first capacitor.

12. The circuit of claim 11 wherein the first and second capacitors are of equal capacitance values.

13. A switched-capacitor analog-to-digital converter, comprising:

an operational amplifier integrator circuit having an input and an output, and including first and second capacitors connected to the amplifier input;

said integrator circuit producing an output voltage level corresponding to the voltage on the first capacitor;

means connectable to the integrator circuit output for resolving the integrator circuit output voltage level into a binary digit value, and providing an output signal indicative thereof;

means connectable to the integrator circuit output for accessing and storing the resolved output voltage level;

means for connecting the second capacitor in a feedback loop between the amplifier input and output, and for connecting the first capacitor between the amplifier input and ground, to cause the voltage on the first capacitor to be transferred to the second capacitor and stored thereon;

means for connecting the first capacitor in a feedback loop between the amplifier input and output, and for connecting the second capacitor between the amplifier input and ground, to cause the voltage stored on the second capacitor to be transferred back to the first capacitor;

means for connecting the output voltage level storing means to the integrator circuit, for causing the voltage stored therein to be transferred to the first capacitor and be added to the voltage transferred from the second capacitor; and means connected to the integrator circuit, for causing a reference voltage level, selectively of either polarity based upon the binary digit value produced by said resolving means, to be placed on the first capacitor along with voltages transferred from the second capacitor and the output voltage storing means.

14. The apparatus of claim 13 wherein said resolving means comprises a comparator circuit for determining whether or not the output voltage level is positive or negative.

15. The apparatus of claim 13 wherein the storing means comprises a sample-and-hold circuit.

16. The apparatus of claim 13 wherein the first and second capacitors are of equal capacitance values.

17. The apparatus of claim 13 wherein the means for placing a reference voltage on the first capacitor comprises:

a first switch coupled to a reference voltage source;

a second switch coupled to ground potential;

said switches being connected to a common circuit node, for alternately connecting the node to the reference voltage source and ground;

a capacitor connected between the circuit node and the integrator circuit input; and means responsive to the binary digit output, for closing the switches in a predetermined sequence to cause a positive or a negative reference voltage to be integrated onto the first capacitor.

18. A switched-capacitor analog-to-digital converter, comprising:

an operational amplifier having an input and an output;

a first capacitor connected to the amplifier input;

a second capacitor connected to the amplifier input, the second capacitor being of equal capacitance value to the first capacitor;

a first switch connected to the first capacitor, for applying thereto an analog input voltage to be converted to a representative digital word;

a second switch for connecting the first capacitor in a feedback loop between the amplifier input and output;

a third switch for grounding the other lead of the first capacitor;

a fourth switch for connecting the second capacitor in a feedback loop between the amplifier input and output;

a fifth switch for grounding the other lead of the second capacitor;

a comparator connectable to the amplifier output, for processing the voltage level available at the amplifier output to determine the polarity, and for producing an output signal of a binary digit value indicative of the determination;

means connectable to the amplifier output, for accessing and storing the amplifier output voltage level received by the comparator;

a sixth switch for connecting the voltage storing means to the first capacitor;

means connected to the amplifier input for causing a reference voltage level selectively of either polarity based upon the result of the comparator determination to be integrated on the first capacitor; and means for actuating said switches in a predetermined sequence to cause (a) an amplifier output voltage level corresponding to the voltage on the first capacitor to be processed by the comparator and stored by the storing means, (b) the voltage on the first capacitor to be transferred to the second capacitor and stored thereon, (c) the voltage stored by the storing means to be transferred to the first capacitor, (d) the voltage stored on the second capacitor to be transferred back to the first capacitor and added to the voltage from the storing means, and (e) a reference voltage to be integrated on the first capacitor.

19. The apparatus of claim 18 wherein said switch actuating means causes the sequence of switch actuations to be repeated N−1 times after an analog input voltage is applied to the first capacitor, where N is the number of binary digits in a digital word into which the analog input voltage is converted.

20. The apparatus of claim 13 or 18 wherein said voltage storing means comprises:

a second operational amplifier having an input and an output;

third and fourth capacitors of equal capacitance values connected to the amplifier input and individually connectable in a feedback loop between the second amplifier input and output;

a switch connecting the output of the first operational amplifier to the third capacitor, for applying the output voltage level thereto;

means for causing the voltage on the third capacitor to be transferred to the fourth capacitor; and means for causing the voltage stored on the fourth capacitor to be transferred back to the third capacitor and made available at the output of the second amplifier.

21. A method of analog-to-digital conversion, comprising the steps of:

(a) sampling an input analog voltage to be converted to a digital word of N binary digits;

(b) storing the voltage sample on a first capacitor;

(c) producing an output voltage corresponding to the voltage on the first capacitor;

(d) determining the polarity of the output voltage and producing a binary signal indicative thereof;

(e) storing the output voltage;

(f) transferring the voltage on the first capacitor to a second capacitor;

(g) transferring the stored output voltage to the first capacitor;

(h) transferring the voltage on the second capacitor back to the first capacitor for addition to the voltage thereon;

(i) causing a reference voltage of a polarity dependent upon the value of said binary signal to be integrated onto the first capacitor; and (j) repeating steps (c) through (i) N−1 times.

22. A method of developing a voltage that is two times a previously existing voltage, comprising the steps of:

establishing a voltage on a first capacitor;

producing an output voltage corresponding to the voltage on the first capacitor;

storing the output voltage;

transferring the voltage on the first capacitor to a second capacitor;

transferring the stored output voltage to the first capacitor; and transferring the voltage on the second capacitor back to the first capacitor for addition to the voltage thereon.

* * * * *

UNITED STATES PATENT AND TRADEMARK OFFICE
CERTIFICATE OF CORRECTION

PATENT NO. : 4,529,965
DATED : July 16, 1985
INVENTOR(S) : Chin-Chen Lee

It is certified that error appears in the above-identified patent and that said Letters Patent is hereby corrected as shown below:

Column 13, line 14, delete "6" and insert --8--.
Column 13, line 17, delete "6" and insert --8--.
Column 7, line 32, delete "conductor 216" and insert
    --a conductor--.
Column 11, line 5, insert --)-- after "∅4."
Column 11, line 41, delete "variious" and insert --various--.

Signed and Sealed this

Seventh Day of January 1986

[SEAL]

Attest:

DONALD J. QUIGG

Attesting Officer     Commissioner of Patents and Trademarks